United States Patent
Chyi

(10) Patent No.: US 8,071,471 B2
(45) Date of Patent: Dec. 6, 2011

(54) PACKAGING CONDUCTIVE STRUCTURE AND METHOD FOR MANUFACTURING THE SAME

(75) Inventor: Jhong Bang Chyi, Sinshih Township, Tainan County (TW)

(73) Assignee: Chipmos Technologies Inc., Hsinchu (TW)

(*) Notice: Subject to any disclaimer, the term of this patent is extended or adjusted under 35 U.S.C. 154(b) by 0 days.

(21) Appl. No.: 13/030,865

(22) Filed: Feb. 18, 2011

(65) Prior Publication Data
US 2011/0143531 A1    Jun. 16, 2011

Related U.S. Application Data

(62) Division of application No. 11/822,096, filed on Jul. 2, 2007, now Pat. No. 7,915,730.

(30) Foreign Application Priority Data

Feb. 16, 2007 (TW) ............................ 96106253 A

(51) Int. Cl.
*H01L 21/768* (2006.01)
(52) U.S. Cl. ............... 438/614; 438/615; 257/E21.589
(58) Field of Classification Search ............ 438/613, 438/614, 615, 617; 257/737, 738, E21.589
See application file for complete search history.

(56) References Cited

U.S. PATENT DOCUMENTS

| | | | |
|---|---|---|---|
| 5,534,465 A | 7/1996 | Frye et al. |
| 6,787,903 B2 | 9/2004 | Yang |
| 6,864,168 B2 | 3/2005 | Chen et al. |
| 7,176,583 B2 | 2/2007 | Daubenspeck et al. |
| 7,667,335 B2 | 2/2010 | Lin et al. |
| 2003/0080421 A1 | 5/2003 | Sawai et al. |
| 2005/0127508 A1 | 6/2005 | Lee et al. |
| 2006/0055032 A1 | 3/2006 | Chang et al. |
| 2006/0055035 A1 | 3/2006 | Lin et al. |

FOREIGN PATENT DOCUMENTS
TW       1236755       7/2005

*Primary Examiner* — Roy Potter
(74) *Attorney, Agent, or Firm* — Muncy, Geissler, Olds & Lowe, PLLC

(57) ABSTRACT

A packaging conductive structure for a semiconductor substrate and a method for manufacturing the structure are provided. The structure comprises an under bump metal (UBM) that overlays a pad of the semiconductor substrate. At least one auxiliary component is disposed on the UBM. Then, a bump conductive layer is disposed thereon and a bump is subsequently formed on the bump conductive layer. Thus, the bump can electrically connect to the pad of the semiconductor substrate through the UBM and the bump conductive layer and can provide better junction buffer capabilities and conductivity.

6 Claims, 4 Drawing Sheets

PACKAGING CONDUCTIVE STRUCTURE AND METHOD FOR MANUFACTURING THE SAME

This application is a divisional of patent application Ser. No. 11/822,096 and claims benefits from the priority of Taiwan Patent Application No. 096106253 filed on Feb. 16, 2007; the disclosures of which are incorporated by reference herein in their entirety.

CROSS-REFERENCES TO RELATED APPLICATIONS

Not applicable.

BACKGROUND OF THE INVENTION

1. Field of the Invention

The present invention relates to a packaging conductive structure for a semiconductor substrate. In particular, the invention relates to a packaging conductive structure capable of enhancing the conductivity and junction buffer.

2. Descriptions of the Related Art

Electronic products have been equipped with semiconductor chips to provide control or logic operation functions. Recent advancement of process technologies has miniaturized semiconductor chips, thereby, gradually reducing the packaging size.

Due to the miniaturization, the conventional wire bonding techniques for connecting semiconductor chips to other devices are no longer applicable. The flip chip bonding technique has replaced the wire bonding technique for connecting the semiconductor chips to other devices using bumps. More specifically, a plurality of bumps electrically connected to the structure inside the chip is disposed on the surface of the semiconductor chip for bonding purposes. In addition, the flip chip bonding technique does not require a large area, as previously required in the conventional wire technique, making it suitable for advanced process.

FIG. 1 is a schematic cross-sectional view showing a conventional semiconductor packaging conductive structure with a pad. The semiconductor chip 10 comprises a substrate 11 and a pad 13 disposed thereon. The pad 13 is usually made of a conductive metallic material and serves as a contact point for electrically connecting to the semiconductor structure within the semiconductor chip 10 and external devices. A passivation layer 15 is disposed on the substrate 11 and overlays the periphery of the pad 13 to expose a portion of the pad 13. Next, an under bump metal (UBM) 17 is formed on the pad 13, and finally a bump 19 is fixed on the UBM 17. Accordingly, the bump 19 may be electrically connected to the pad 13 through the UBM 17.

However, in the conventional packaging conductive structure, the capability of the junction buffer of the bump 19 on the UBM 17 is limited in structure and material. In addition, the conductive area of the pad 13 is decided before packaging. Once the process proceeds with poor control or improper selections of the materials, a breakage may occur due to the poor junction in the bump 19. As a result, the bump 19 may peel off and cause the semiconductor chip to fail.

Accordingly, providing a packaging conductive structure with better junction buffer capabilities and conductivity is highly desired in the semiconductor industry.

SUMMARY OF THE INVENTION

The primary objective of this invention is to provide a packaging conductive structure for a semiconductor substrate and a method of manufacturing the same. At least one auxiliary component is disposed in the packaging conductive structure to increase the contact area between the bump conductive layer and bump. This auxiliary component may also provide an elastic buffer to further enhance the capability of junction buffer and lower the possibility of breakage between the bump and bump conductive layer.

Another objective of this invention is to provide a packaging conductive structure for a semiconductor substrate and a method of manufacturing the same. The conductive area may be increased with rearrangement of the UBM and bump conductive layer, enhancing the capability of the junction buffer and further improving the conductivity thereof.

To achieve the above and other objectives, the present invention provides a packaging conductive structure for a semiconductor substrate and a method of manufacturing the same. First, a passivation layer is formed on the semiconductor substrate for partially overlaying the pad and defining a receiving space. Then, an UBM is formed and electrically connected to the pad of the semiconductor substrate. Next, at least one auxiliary component is formed on the UBM, while a bump conductive layer is formed to overlay the UBM and the auxiliary component. Finally, a bump is formed on the bump conductive layer. Thus, the bump can electrically connect to the pad of the semiconductor substrate through the UBM and the bump conductive layer.

The detailed technology and preferred embodiments implemented for the subject invention are described in the following paragraphs accompanying the appended drawings for people skilled in this field to well appreciate the features of the claimed invention.

DESCRIPTION OF THE PREFERRED EMBODIMENT

Figure 1:
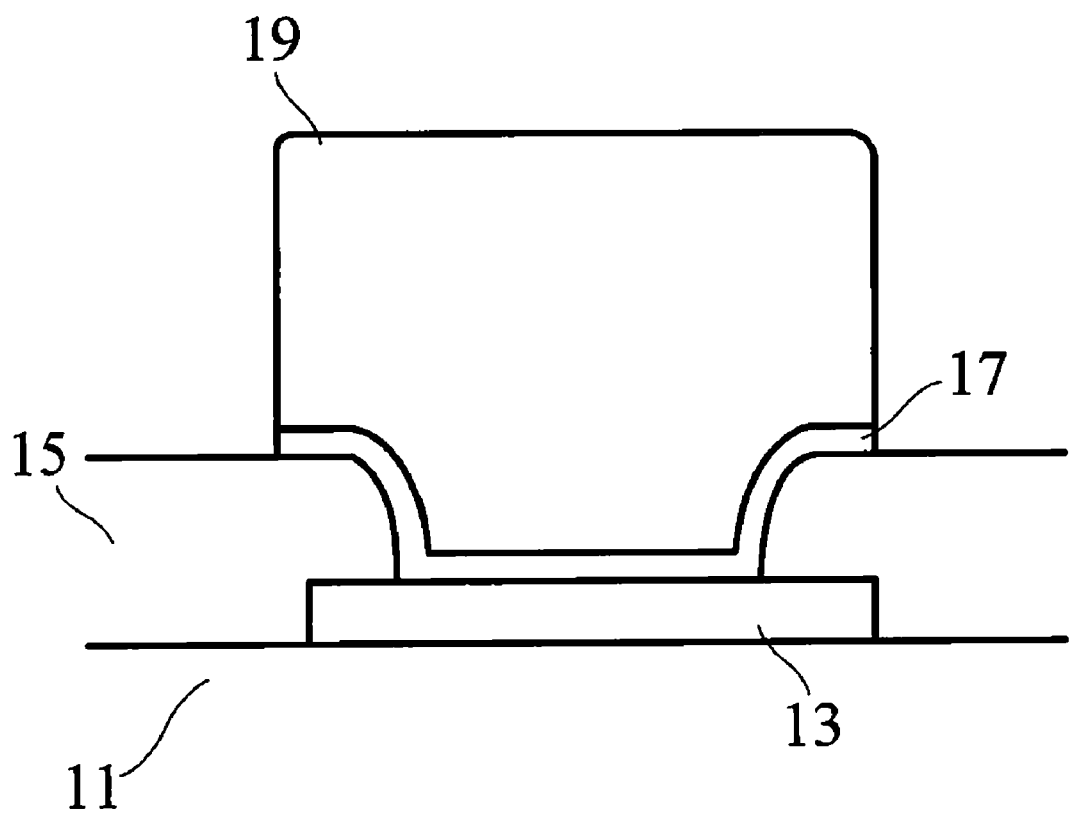
FIG. 1 is a schematic cross-sectional view showing a conventional semiconductor packaging conductive structure.
Figure 2:
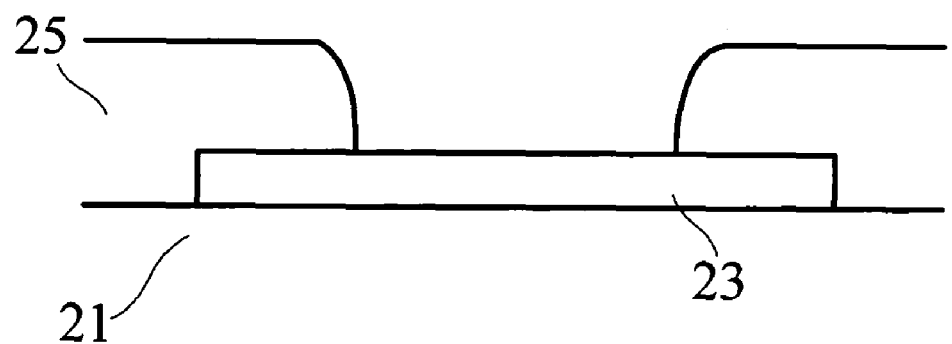
FIG. 2 is a schematic cross-sectional view showing the manufacturing process according to a preferred embodiment of the present invention.

A packaging conductive structure for a semiconductor substrate and a method of manufacturing the same are disclosed in the present invention. First, in reference to FIG. 2, a semiconductor substrate 21 comprises a pad 23 disposed thereon. The pad 23 is usually made of aluminum and serves as a contact point between the semiconductor structure within the semiconductor substrate 21 and external devices. Then, a passivation layer 25 is formed on the semiconductor substrate 21 for partially overlaying the pad 23 and defining a receiving space. During the manufacturing process, a photoresistance layer may be previously formed for the etching process to remove the unnecessary portions of the photoresistance material after patterning. The receiving space is then formed with a portion of the pad 23 exposed.

Figure 3:
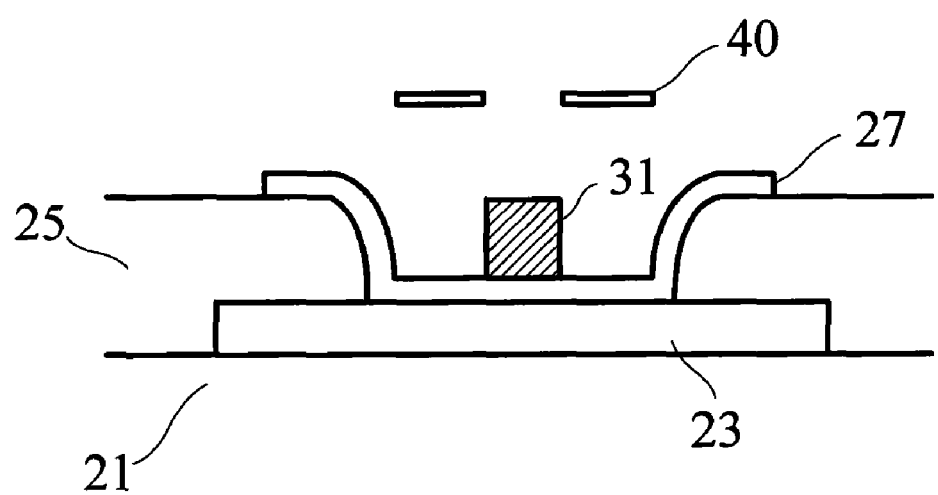
FIG. 3 is a schematic cross-sectional view showing the manufacturing process according to the preferred embodiment of the present invention.

In FIG. 3, an under bump metal (UBM) 27 is formed in the receiving space for an electrically connection to the pad 23 of the semiconductor substrate 21, wherein the UBM 27 is made of a titanium/tungsten (Ti/W) alloy or chromium. More specifically, the UBM 27 includes a central portion and a periphery portion. The periphery portion of the UBM 27 partially overlays an edge of the passivation layer 25, while the central portion of the UBM 27 is bonded to the pad 23 of the semiconductor substrate 21.

Figure 4:
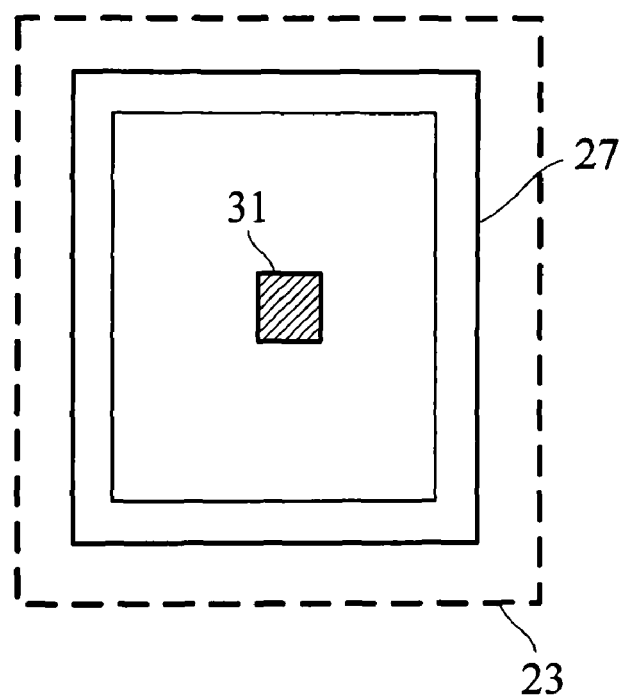
FIG. 4 is a schematic top view showing the auxiliary component according to the preferred embodiment of the present invention.

FIG. 4 is a schematic top view showing the packaging conductive structure of the present invention. At least one auxiliary component 31 is formed within the receiving space. More specifically, the auxiliary component 31 is formed on the central portion of the UBM 27. During the manufacturing process, a photolithography process is performed using a mask 40 to form the rudimental structure of the auxiliary component 31. Then, a heating process is performed for solidification to form the auxiliary component 31. The auxiliary component 31 should be made of polyimide (PI) and protruding to form a structure with resilience and provide a junction buffer.

Figure 5:
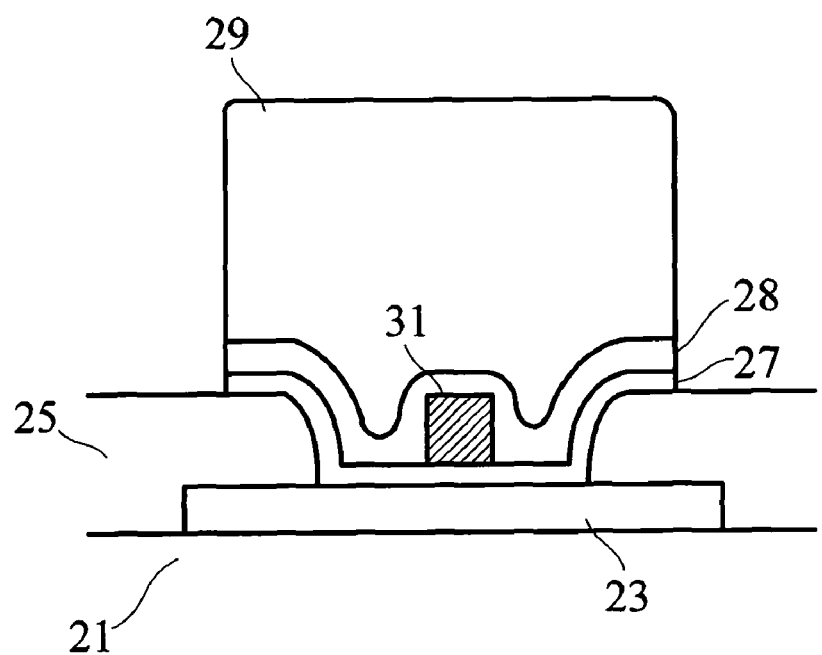
FIG. 5 is a schematic cross-sectional view showing the preferred embodiment of the present invention.

As shown in FIG. 5, a bump conductive layer 28 overlaying the UBM 27 and the auxiliary component 31 is subsequently formed. Preferably, the bump conductive layer 28 is made of gold or chromium for better conductivity. Finally, a bump 29 is formed on the bump conductive layer 28. The bump 29 may be electrically connected to the pad 23 of the semiconductor substrate 21 through the bump conductive layer 28 and the UBM 27.

Figure 6:
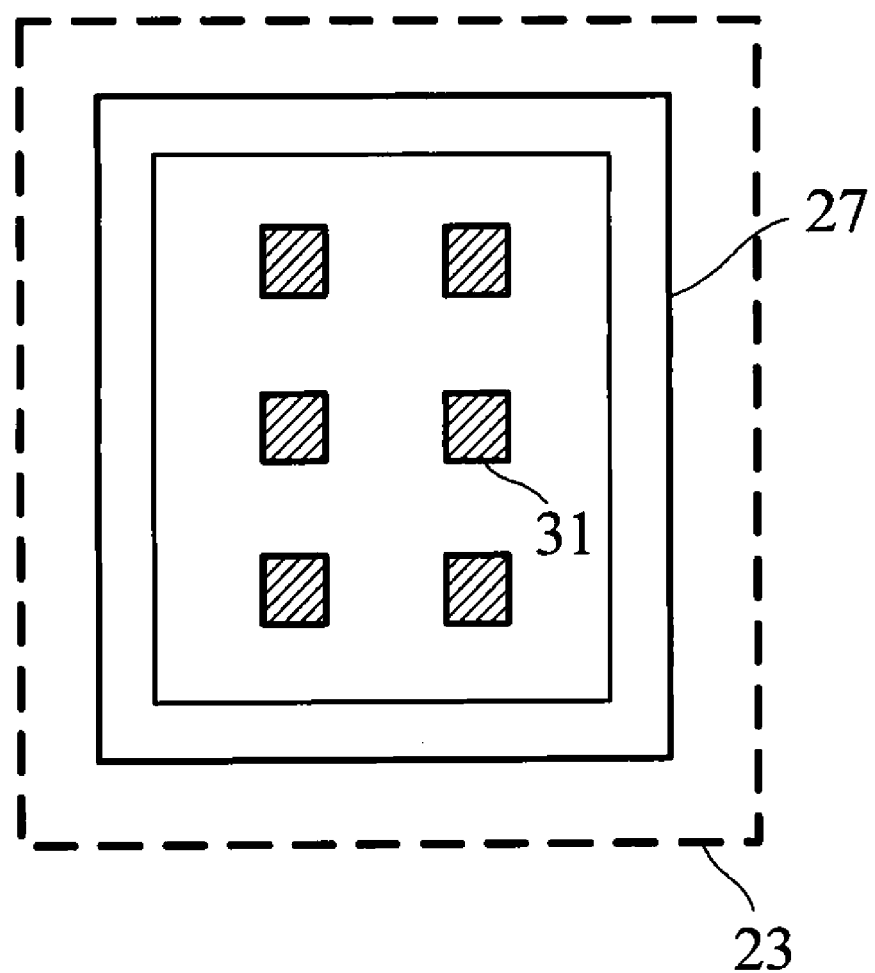
FIG. 6 is a schematic top view showing the auxiliary component according to another preferred embodiment of the present invention.

In reference to FIG. 4, the above-mentioned embodiment only uses one auxiliary component 31; however, the auxiliary component 31 is not limited to the number or type in the present invention. Those skilled in the art may adjust the number or type of the auxiliary component 31 according to different requirements. Another preferred embodiment is shown in FIG. 6. The packaging conductive structure may further comprise a plurality of auxiliary components 31 to attain better junction buffer capabilities and conductivity. By arranging the auxiliary component in the packaging conductive structure, the junction buffer capability may be enhanced. In addition, the contact area of the conductive layer may be increased at the same time, thus, enhancing the conductivity thereof.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A method for manufacturing a packaging conductive structure for a semiconductor substrate with a pad, the method comprising the steps of:
    (a) forming a passivation layer on the semiconductor substrate for partially overlaying the pad and defining a receiving space;
    (b) forming an under bump metal in the receiving space for electrically connecting with the pad, wherein the under bump metal includes a central portion and a periphery portion, in which the central portion is disposed in the receiving space and partially bonds to the pad, and the periphery portion partially overlays an edge of the passivation layer;
    (c) forming at least one auxiliary component on the under bump metal;
    (d) forming a bump conductive layer overlaying the under bump metal and the at least one auxiliary component; and
    (e) forming a bump on the bump conductive layer to electrically connect with the pad through the bump conductive layer and the under bump metal.

2. The method as claimed in claim 1, wherein the step (a) further comprises the steps of:
    forming a photoresistance layer; and
    etching the photoresistance layer.

3. The method as claimed in claim 1, wherein the step (c) further comprises the steps of:
    performing a photolithography process, to form the at least one auxiliary component on the under bump metal; and
    heating the at least one auxiliary component for solidification.

4. The method as claimed in claim 1, wherein the at least one auxiliary component is made of polyimide (PI).

5. The method as claimed in claim 1, wherein the under bump metal is made of titanium/tungsten (Ti/W) alloy or chromium.

6. The method as claimed in claim 1, wherein the bump conductive layer is made of gold or chromium.

* * * * *